(12) United States Patent
Han et al.

(10) Patent No.: US 7,608,370 B2
(45) Date of Patent: Oct. 27, 2009

(54) EXPOSURE MASK AND METHOD FOR MANUFACTURING SEMICONDUCTOR DEVICE USING THE SAME

(75) Inventors: Sang Jun Han, Gyeonggi-do (KR); Myung Goon Gil, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 365 days.

(21) Appl. No.: 11/617,693

(22) Filed: Dec. 28, 2006

(65) Prior Publication Data

US 2007/0298332 A1    Dec. 27, 2007

(30) Foreign Application Priority Data

Jun. 27, 2006   (KR) ...................... 10-2006-0057948

(51) Int. Cl.
*G03F 1/00* (2006.01)

(52) U.S. Cl. .......................................... 430/5

(58) Field of Classification Search ..................... 430/5, 430/30, 321, 322, 394
See application file for complete search history.

(56) References Cited

U.S. PATENT DOCUMENTS

| 6,022,645 A | 2/2000 | Lin |
| 6,249,335 B1 * | 6/2001 | Hirukawa et al. ............. 355/53 |

FOREIGN PATENT DOCUMENTS

| KR | 10-1996-0000179 B1 | 1/1996 |
| KR | 1019960000179 B1 | 1/1996 |

* cited by examiner

*Primary Examiner*—Stephen Rosasco
(74) *Attorney, Agent, or Firm*—Townsend and Townsend and Crew LLP

(57) ABSTRACT

An exposure mask of a semiconductor device comprises a substrate. Recesses are etched on a surface of the substrate to change a refractive index of an incident light. The changed refractive index causes a diffraction angle of the incident light to increase or decrease. As a result of the change in the diffraction angle, ultra fine patterns for highly integrated semiconductor devices may be formed without being adversely impacted by a proximity effect.

20 Claims, 4 Drawing Sheets

EXPOSURE MASK AND METHOD FOR MANUFACTURING SEMICONDUCTOR DEVICE USING THE SAME

CROSS-REFERENCES TO RELATED APPLICATIONS

The present application claims priority to Korean patent application number 10-2006-0057948, filed on Jun. 27, 2006, which is herein incorporated by reference in its entirety.

BACKGROUND OF THE INVENTION

The present invention generally relates to an exposure mask and for manufacturing semiconductor device using the same, and more specifically, to an exposure mask that can form ultra fine patterns while reducing the impact of a proximity effect due to highly integrated semiconductor devices.

In the manufacture of semiconductor devices, an exposure process is performed by light irradiated from a light source and transmitted through an optical system. A fine pattern of an exposure mask is transcribed onto a wafer coated with a photoresist film. A developing process is performed on the resulting structure to obtain a photoresist pattern where the fine pattern is defined.

The light is passed through the exposure mask to generate diffraction lights including a $+1^{st}$ light, a $0^{th}$ light and a $-1^{st}$ light. A pattern is formed by the $+1^{st}$ light and the $-1^{st}$ light that enter an entrance pupil.

BRIEF SUMMARY OF THE INVENTION

Various embodiments of the present invention are directed at an exposure mask of semiconductor device. The exposure mask comprises a substrate on which recesses are formed using an etching process. The recesses change a refractive index of an incident light. The changed refractive index causes a diffraction angle of the incident light to increase or decrease. As a result of the changed diffraction angle, ultra fine patterns may be obtained for highly integrated semiconductor devices.

According to an embodiment of the present invention, an exposure mask of semiconductor device using the same comprises a substrate, a plurality of opaque patterns formed on a surface of the substrate, and a plurality of transparent scratch patterns formed on a surface of the substrate between adjacent opaque patterns. The opaque patterns are formed of chromium (Cr) in a line/space pattern.

According to an embodiment of the present invention, a method for manufacturing a semiconductor device comprises the steps of: forming a photoresist film over a semiconductor substrate, performing an exposure process using the above-described exposure mask, performing a develop process to form a photoresist pattern.

In one embodiment, the opaque patterns are formed on the substrate at a first pitch. The transparent scratch patterns are formed on the substrate at a second pitch that is smaller than the first pitch.

In another embodiment, some of the opaque patterns are formed at a first pitch and the remainder of the opaque patterns are formed at a second pitch. The transparent scratch patterns are formed at a third pitch which is smaller than either the first pitch or the second pitch.

The transparent scratch patterns may be formed on the same surface of the substrate as the opaque patterns. Alternatively, the transparent scratch patterns are formed on the opposite surface of the substrate.

Each transparent scratch pattern includes recesses defined in the substrate. In one embodiment, the recesses may be formed using a focused ion beam or a laser. In another embodiment, the recesses may be formed using an etching process. Each recess is formed such that the perimeter of the recess decreases in a discrete step-wise fashion as the depth of the substrate in which the recess is etched increases.

DETAILED DESCRIPTION OF THE SPECIFIC EMBODIMENT

Figure 1:
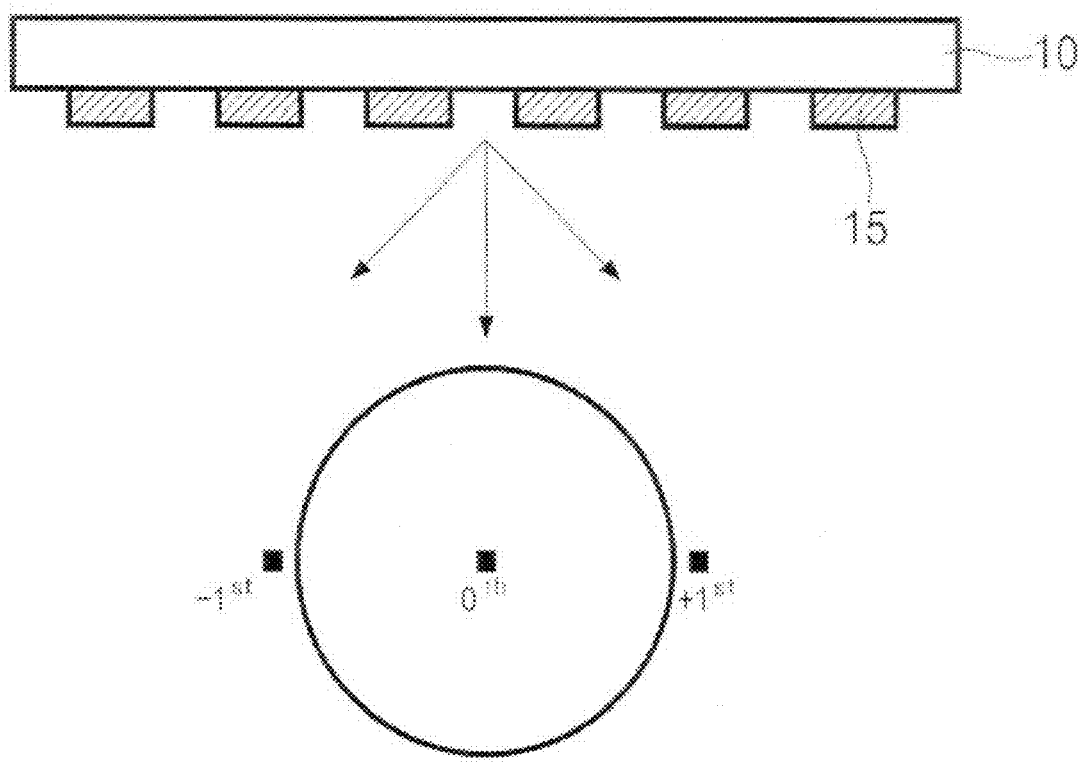
FIG. 1 is a cross-sectional diagram illustrating a conventional exposure mask of semiconductor device.

The present invention will be described in detail with reference to the accompanying drawings. FIG. 1 is a cross-sectional diagram illustrating a conventional exposure mask and for manufacturing semiconductor device using the same.

An exposure process is performed with a conventional exposure mask that comprises opaque patterns 15 formed over a substrate 10. The opaque patterns 15 form a line/space pattern. An incident light is passed through the exposure mask to obtain diffraction light. The direction of the diffraction light is shown by the arrows in FIG. 1. Each opaque pattern 15 is formed using chromium. The line/space ratio of the opaque patterns 15 has a pitch ratio of 1:1. The pitch identifies the amount of space between adjacent patterns.

As a pitch becomes smaller during the exposure process, the diffraction angles of the $+1^{st}$ light and the $-1^{st}$ light become larger. The $+1^{st}$ light and the $-1^{st}$ light are distributed to form the patterns. As the diffraction angle becomes larger, it is difficult for the $+1^{st}$ light and the $-1^{st}$ light to enter an entrance pupil 20. As a result, it is difficult to form a fine pattern at a small pitch.

In order to form fine patterns of highly integrated devices, the amount of the $+1^{st}$ light and the $-1^{st}$ light is increased. Alternatively, the amount of the $0^{th}$ light is decreased. Thus, the amount of the $+1^{st}$ light and the $-1^{st}$ light that can enter the entrance pupil 20 is increased to improve contrast.

In the above-described conventional exposure mask of the semiconductor device, it is difficult to form a fine pattern with a conventional numerical aperture. When using the numerical aperture, the diffraction angle of the incident light increases as the pitch of the opaque patterns on the exposure mask decreases.

Figure 2A:
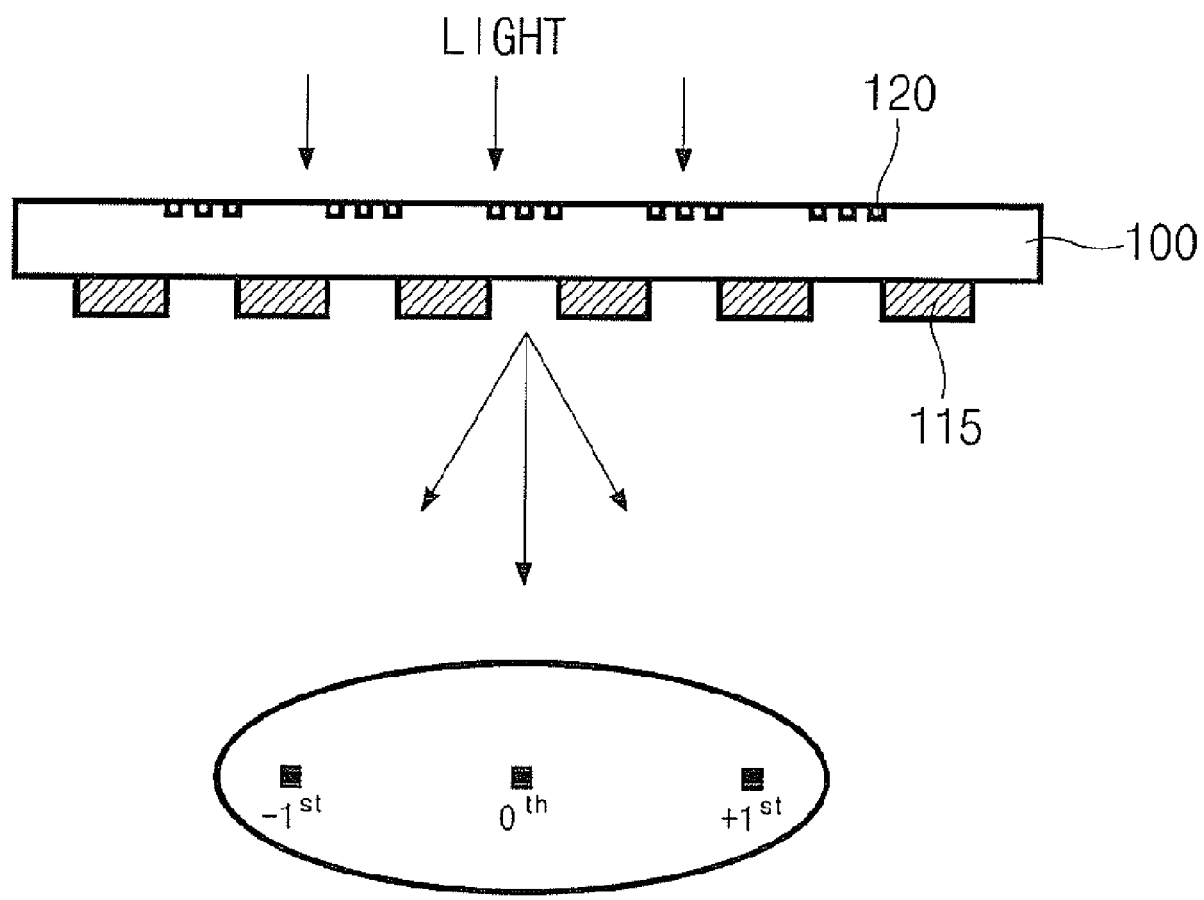
FIGS. 2a and 2b are diagrams illustrating an exposure mask of semiconductor device according to an embodiment of the present invention.
Figure 2B:
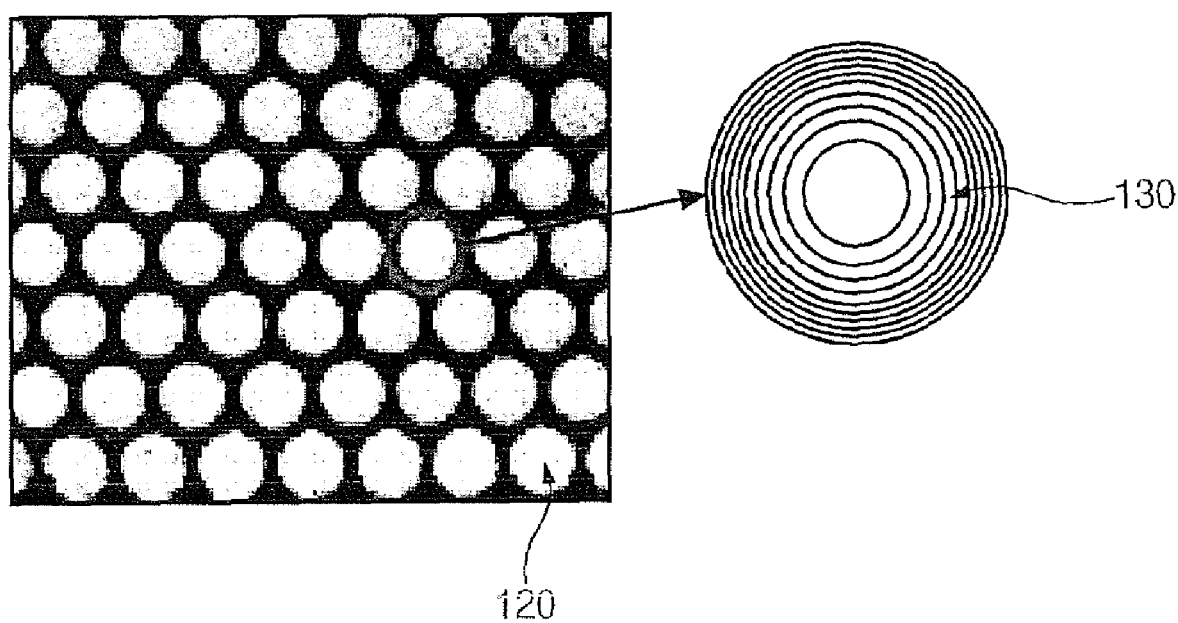

FIGS. 2a and 2b are diagrams illustrating an exposure mask of semiconductor according to an embodiment of the present invention. Opaque patterns 115 are formed over a surface of a substrate 100. The opaque patterns 115 are formed with spaces defined between adjacent opaque patterns 115. In one embodiment, the opaque patterns 115 are a line/space patterns that have a line/space pitch ratio of 1:1. In another embodiment, each opaque pattern 115 is formed using chromium.

Transparent scratch patterns 120 are also formed on a surface of the substrate 100. A plurality of the transparent scratch patterns 120 are formed on the substrate 100 between adjacent opaque patterns 115. In one embodiment, the transparent scratch patterns 120 are formed over the same surface of the substrate 100 as the opaque patterns 115. Alternatively, the transparent scratch patterns 120 are formed over the opposite surface of the substrate 100. A pitch of the transparent scratch patterns 120 is smaller than that of the opaque patterns 115.

As shown in FIG. 2a three transparent scratch patterns 120 are formed on the substrate 100 between adjacent opaque patterns 115 on the opposite surface of the substrate 100 as the opaque patterns 115. One having skill in the art would understand that additional transparent scratch patterns 120 could be formed between adjacent opaque patterns 115. One having skill in the art would also understand that the transparent scratch patterns 120 could be formed between adjacent opaque patterns 115 on the same surface of the substrate 100 as the opaque patterns 115.

In one embodiment, each transparent scratch pattern 120 is formed using a focused ion beam. In another embodiment, each transparent scratch pattern 120 is formed using a laser. Each transparent scratch pattern 120 may include recesses that are etched in a region of the substrate 100 where the focused ion beam or the laser contacts the surface of the substrate 100. In one embodiment, each recess is etched in the substrate 100 in a discrete step-wise fashion such that the perimeter of the recess decreases in discrete steps as the depth of the substrate 100 increases (as shown in FIG. 2b).

During the exposure process, the incident light is projected onto the exposure mask. The transparent scratch patterns 120 (i.e., the recesses) change a refractive index of the incident light while the incident light passes through the exposure mask. The opaque patterns 115 and the transparent scratch patterns 120 of the exposure mask cause a diffraction angle to decrease. As a result of the decreased diffraction angle, a $+1^{st}$ light and a $-1^{st}$ light are drawn closer to the $0^{th}$ light so that an increased amount of the $+1^{st}$ light and the $-1^{st}$ light enters the entrance pupil 125. The increased amount of the $+1^{st}$ light and the $-1^{st}$ light that enters the entrance pupil facilitates the formation of a fine pitch pattern.

FIG. 2b shows the transparent scratch patterns 120 formed over the substrate 100. As shown in the figure, the transparent scratch patterns 120 include a plurality of the recesses 130 that are etched in a surface of the substrate 100. In one embodiment, each recess 130 is circular. The recess 130 is etched in the substrate 100 in a discrete step-wise fashion such that a circumference of the recess 130 decreases in discrete steps as the depth of the substrate 100 increases. As a result of the decreasing perimeter of the recess 130 in a step-wise fashion, horizontal incident light is diffracted.

Figure 3:
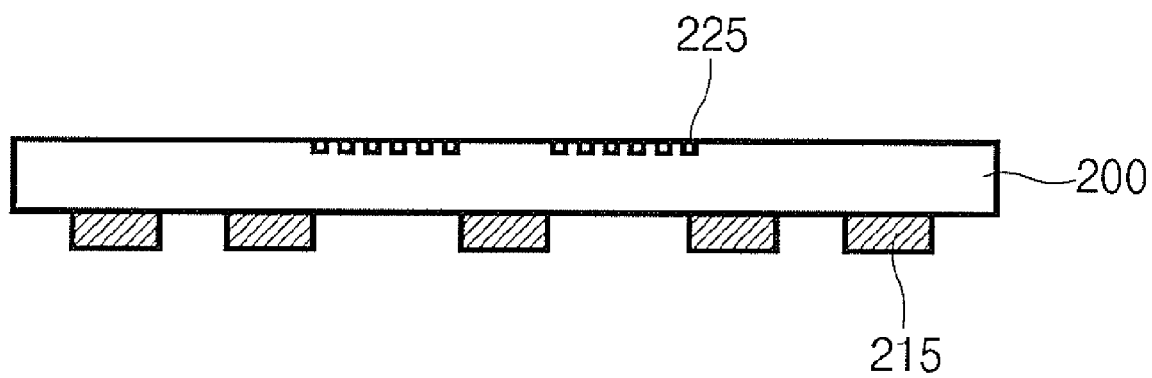
FIG. 3 is a cross-sectional diagram illustrating an exposure mask of semiconductor device according to an embodiment of the present invention.

FIG. 3 is a cross-sectional diagram illustrating an exposure mask of semiconductor device according to an embodiment of the present invention. Opaque patterns 215 are formed over one surface of a substrate 200. In one embodiment, the opaque patterns 215 are formed of chromium. In another embodiment, each opaque pattern is a line/space pattern. The opaque patterns 215 are formed at various pitches such that adjacent opaque patterns 215 may be differently spaced. In one embodiment, the opaque patterns are formed at a first pitch(D1) and a second pitch(D2) that is smaller than the first pitch(D1).

Transparent scratch patterns 225 are formed by etching the substrate 200 at a location between adjacent opaque patterns 215 that have a large pitch (e.g., the first pitch). The transparent scratch patterns may be formed on the same surface of the substrate 200 as the opaque patterns 215 or on the opposite surface of the substrate 200. The transparent scratch patterns 225 are formed on the surface of the substrate 200 at a pitch that is smaller than the first and second pitches of the opaque patterns 215.

Each transparent scratch pattern 225 includes recesses formed by etching. The recesses may be etched using a focused ion beam or a laser. Each recess is formed by etching the substrate 200 in a discrete step-wise fashion such that the etched area decreases as the depth of the substrate 200 increases. The discrete step shape of recesses changes the refractive index of the incident light to increase the angle of the diffraction light.

When the exposure process is performed, the refractive index of the incident light is changed by the transparent scratch patterns 225 and the diffraction angle decreases. As a result, a pattern can be obtained that has a fine pitch.

According to the method for manufacturing a semiconductor device using the exposure mask of FIG. 2a and FIG. 3, a photoresist film (not shown) is formed over a semiconductor substrate (not shown). An exposure process is performed using the exposure mask of FIG. 2a and FIG. 3. A develop process is performed on the resulting sturture to form photoresist pattern(not shown).

The exposure process is performed with a light source selected from the group consisting of I-line, KrF, ArF, EUV, E-Beam and X-ray.

As described above, in an exposure mask and for manufacturing semiconductor device using the same according to an embodiment of the present invention, recesses etched in a substrate with a discrete step shape change a refractive index of an incident light. As a result of the change in the refractive index, a diffraction angle of the incident light is increased or decreased. Thus, ultra fine patterns for highly integrated semiconductor devices may be formed without being adversely impacted by a proximity effect.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. An exposure mask of a semiconductor device, the mask comprising:
    a substrate;
    a plurality of opaque patterns formed over the substrate; and
    a plurality of transparent scratch patterns formed over the substrate between adjacent opaque patterns,
      wherein the transparent scratch patterns include a plurality of recesses formed in a discrete step-wise manner, a circumference of each recess decreasing in discrete steps as a depth of the substrate increases.

2. The exposure mask according to claim 1, wherein each opaque pattern is formed of chromium.

3. The exposure mask according to claim 1, wherein each opaque pattern is a line/space pattern.

4. The exposure mask according to claim 3, wherein the opaque patterns are formed at substantially the same pitch.

5. The exposure mask according to claim 3, wherein the opaque patterns are formed at a first pitch and the transparent scratch patterns are formed at a second pitch, the second pitch being smaller than the first pitch.

6. The exposure mask according to claim 3, wherein the opaque patterns are formed at a first pitch and a second pitch which are different from each other; and the transparent scratch patterns are formed at a third pitch, which is smaller than either the first or the second pitch.

7. The exposure mask according to claim 6, wherein the transparent scratch patterns are formed over the substrate between the opaque patterns having the first pitch.

8. The exposure mask according to claim 1, wherein the transparent scratch patterns are formed over the same surface of the substrate where the opaque patterns are formed.

9. The exposure mask according to claim 1, wherein the transparent scratch patterns are formed on the same side as or the opposite side to the surface of the substrate where the opaque patterns are formed.

10. The exposure mask according to claim 1, wherein the recesses are formed using a focused ion beam or a laser.

11. The exposure mask according to claim 1, wherein the recesses are formed by an etching method.

12. A method for manufacturing a semiconductor device, the method comprising the steps of:
   forming a photoresist film over a semiconductor substrate;
   performing an exposure process using the exposure mask of claim 1; and
   performing a develop process to form a photoresist pattern.

13. A method for manufacturing a semiconductor device, comprising the step of :
   performing a lithography process employing the exposure mask of claim 1.

14. An exposure mask of a semiconductor device, the mask comprising:
   a substrate;
   a plurality of opaque patterns formed over the substrate; and
   a plurality of recess pattern formed over the substrate between adjacent opaque patterns, wherein the transparent scratch patterns include a plurality of recesses, a circumference of each recess decreasing as a depth of the substrate increases.

15. The exposure mask according to claim 14, wherein the opaque patterns are formed at substantially the same pitch.

16. The exposure mask according to claim 14, wherein the opaque patterns are formed at a first pitch and the recess pattern is formed at a second pitch, the second pitch being smaller than the first pitch.

17. The exposure mask according to claim 14, wherein the opaque patterns are formed at a first pitch and a second pitch which are different from each other; and the transparent scratch patterns are formed at a third pitch which is smaller than either the first or the second pitch.

18. The exposure mask according to claim 17, wherein the transparent scratch patterns are formed over the substrate between the opaque patterns having the first pitch.

19. The exposure mask according to claim 14, wherein the transparent scratch patterns are formed over the same surface of the substrate where the opaque patterns are formed.

20. The exposure mask according to claim 14, wherein the transparent scratch patterns are formed on same side as or the opposite side to the surface of the substrate where the opaque patterns are formed.

* * * * *